US009136219B2

(12) United States Patent
Iwase et al.

(10) Patent No.: US 9,136,219 B2
(45) Date of Patent: Sep. 15, 2015

(54) EXPANDED SEMICONDUCTOR CHIP AND SEMICONDUCTOR DEVICE

(71) Applicant: Panasonic Corporation, Osaka (JP)

(72) Inventors: Teppei Iwase, Hyogo (JP); Kiyomi Hagihara, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/150,856

(22) Filed: Jan. 9, 2014

(65) Prior Publication Data

US 2014/0124957 A1 May 8, 2014

Related U.S. Application Data

(63) Continuation of application No. PCT/JP2012/005307, filed on Aug. 24, 2012.

(30) Foreign Application Priority Data

Nov. 16, 2011 (JP) ................................ 2011-250758

(51) Int. Cl.
*H01L 23/48* (2006.01)
*H01L 23/52* (2006.01)
(Continued)

(52) U.S. Cl.
CPC ........ *H01L 23/5386* (2013.01); *H01L 23/5389* (2013.01); *H01L 24/05* (2013.01); *H01L 24/19* (2013.01); *H01L 24/20* (2013.01); *H01L 24/96* (2013.01); *H01L 25/0652* (2013.01); *H01L 24/06* (2013.01); *H01L 24/13* (2013.01);
(Continued)

(58) Field of Classification Search
CPC ..... H01L 23/5386; H01L 24/05; H01L 24/19; H01L 24/20; H01L 24/96; H01L 24/14; H01L 24/13; H01L 24/06; H01L 23/5389
USPC ........................................................ 257/777
See application file for complete search history.

(56) References Cited

U.S. PATENT DOCUMENTS

| | | | | |
|---|---|---|---|---|
| 6,348,728 | B1 | 2/2002 | Aiba et al. | |
| 2006/0163728 | A1 | 7/2006 | Nakanishi et al. | |
| 2011/0068459 | A1* | 3/2011 | Pagaila et al. | 257/698 |
| 2014/0103502 | A1* | 4/2014 | Yokoyama et al. | 257/666 |
| 2014/0103504 | A1* | 4/2014 | Yamashita et al. | 257/668 |

FOREIGN PATENT DOCUMENTS

| | | |
|---|---|---|
| JP | 1-276750 | 11/1989 |
| JP | 11-177020 | 7/1999 |

(Continued)

OTHER PUBLICATIONS

International Search Report of PCT Application No. PCT/JP2012/005307 dated Oct. 9, 2012.

*Primary Examiner* — Nicholas Tobergte
(74) *Attorney, Agent, or Firm* — Panasonic Patent Center

(57) ABSTRACT

A semiconductor device includes: a first semiconductor chip having a surface provided with first electrodes; and an expanded semiconductor chip including a second semiconductor chip and an expanded portion extending outward from at least one side surface of the second semiconductor chip. The expanded semiconductor chip has a surface provided with second electrodes. The surface of the first semiconductor chip provided with the first electrodes faces the surface of the expanded semiconductor chip provided with the second electrodes so that the first electrodes are connected to the second electrodes. Each one of the second electrodes that is connected to an associated one of the first electrodes is located only on the expanded portion.

7 Claims, 6 Drawing Sheets

(51) Int. Cl.

| | |
|---|---|
| ***H01L 29/40*** | (2006.01) |
| ***H01L 23/538*** | (2006.01) |
| ***H01L 23/00*** | (2006.01) |
| ***H01L 25/065*** | (2006.01) |

(52) U.S. Cl.

CPC ......... *H01L24/16* (2013.01); *H01L 2224/0239* (2013.01); *H01L 2224/02375* (2013.01); *H01L 2224/02381* (2013.01); *H01L 2224/0401* (2013.01); *H01L 2224/04105* (2013.01); *H01L 2224/05569* (2013.01); *H01L 2224/06155* (2013.01); *H01L 2224/06156* (2013.01); *H01L 2224/12105* (2013.01); *H01L 2224/131* (2013.01); *H01L 2224/13144* (2013.01); *H01L 2224/16145* (2013.01); *H01L 2224/16225* (2013.01); *H01L 2225/06513* (2013.01); *H01L 2225/06527* (2013.01); *H01L 2924/00014* (2013.01); *H01L 2924/01029* (2013.01); *H01L 2924/18162* (2013.01); *H01L 2924/351* (2013.01)

(56) References Cited

FOREIGN PATENT DOCUMENTS

| | | |
|---|---|---|
| JP | 2000-124354 | 4/2000 |
| JP | 2001-217381 | 8/2001 |
| JP | 2006-203079 | 8/2006 |
| JP | 2007-103716 | 4/2007 |
| JP | 2009-200274 | 9/2009 |
| JP | 2010-141080 | 6/2010 |

* cited by examiner

EXPANDED SEMICONDUCTOR CHIP AND SEMICONDUCTOR DEVICE

CROSS-REFERENCE TO RELATED APPLICATIONS

This is a continuation of International Application No. PCT/JP2012/005307 filed on Aug. 24, 2012, which claims priority to Japanese Patent Application No. 2011-250758 filed on Nov. 16, 2011. The entire disclosures of these applications are incorporated by reference herein.

BACKGROUND

The present disclosure relates to expanded semiconductor chips and semiconductor devices, and particularly to a semiconductor device including a face-down mounted expanded semiconductor chip.

With the advancement of function of systems including digital televisions and digital recorders, the amount of data processed by the systems has increased significantly. Accordingly, semiconductor memories installed in the systems have been required to have larger capacity and higher data transfer rate.

Semiconductor devices incorporating such semiconductor memories include a system-on-chip (SoC) device in which a logic circuit including a memory controller and a memory circuit are integrated into one chip and a system-in-package (SiP) device in which a logic circuit chip including a memory controller and a memory circuit chip are stacked in one package.

Systems using SiP devices that can be manufactured at relatively low cost have become more popular in recent years. Electrical connection between a logic circuit chip and a memory circuit chip that are stacked in a semiconductor device with an SiP structure can be established by, for example, a chip-on-chip technique of electrically connecting electrodes on the logic circuit chip to electrodes on the memory circuit chip via metal protrusions (bumps) of, for example, solder, with element formation surfaces of these chips facing each other. This technique is employed in order to increase the data transfer rate (see, for example, Japanese Unexamined Patent Publication No. 2010-141080).

SUMMARY

With size reduction of semiconductor devices, active elements (especially transistors) included in logic circuit chips have been downsized. Electrical characteristics of transistors are easily affected by thermal stress generated during packaging of semiconductor chips. For example, in CoC bonding of semiconductor chips, a bonding material such as solder melts, and residual stress occurring on the element formation surfaces of the semiconductor chips upon solidification causes a large variation of source/drain current of transistors. To catch up with miniaturization of transistors, materials having low dielectric constants called low-k materials are employed as insulating materials for use in multilevel interconnect layers of semiconductor chips. The low-k materials generally have low mechanical strengths. Thus, stress applied on an element formation surface of a semiconductor chip during packaging causes cracks to be generated in an insulating layer of the low-k material or the insulating layer to be peeled off at the interface or the vicinity thereof between the insulating layer and its adjacent interconnect material.

It is therefore an object of the present disclosure to reduce the influence of thermal stress generated during packaging of semiconductor chips on electrical characteristics of, for example, active elements included in the semiconductor chips with reduced physical damage on components of the semiconductor chips.

In order to achieve the object, the present disclosure provides a configuration in which at least a semiconductor chip includes an expanded portion extending outward from at least one side surface of the semiconductor chip and an electrode is provided on the expanded portion so as to be electrically connected to an external element.

Specifically, a first semiconductor device according to the present disclosure includes: a first semiconductor chip having a surface provided with first electrodes; and an expanded semiconductor chip including a second semiconductor chip and an expanded portion extending outward from at least one side surface of the second semiconductor chip, and the expanded semiconductor chip has a surface provided with second electrodes. The surface of the first semiconductor chip provided with the first electrodes faces the surface of the expanded semiconductor chip provided with the second electrodes so that the first electrodes are connected to the second electrodes. Each of the second electrodes on the expanded semiconductor chip that is connected to an associated one of the first electrodes is located only on the expanded portion.

In the first semiconductor device, each one of the second electrodes that is connected to an associated one of the first electrodes is located only on the expanded portion. Thus, no second electrodes electrically connected to the first semiconductor chip are provided on the element formation surface of the second semiconductor chip constituting the expanded semiconductor chip. As a result, the influence of thermal stress generated during packaging on electrical characteristics of an active element included in the second semiconductor chip can be avoided.

In the first semiconductor device, the second semiconductor chip may include a plurality of semiconductor chips, and the expanded portion of the expanded semiconductor chip may be located between adjacent side surfaces of the semiconductor chips of the second semiconductor chip.

In the first semiconductor device, the expanded portion of the expanded semiconductor chip may be located around the second semiconductor chip.

In the first semiconductor device, the expanded semiconductor chip may include an interconnection that connects the second electrodes on a surface of the expanded portion to third electrodes on an element formation surface of the second semiconductor chip.

In the first semiconductor device, the expanded portion may have a through hole in a region facing the first semiconductor chip, and a gap between the first semiconductor chip and the expanded semiconductor chip and the through hole may be filled with an encapsulating resin material.

A second semiconductor device according to the present disclosure includes: a wiring substrate having a surface provided with first electrodes; and an expanded semiconductor chip including a semiconductor chip and an expanded portion extending outward from at least one side surface of the semiconductor chip, and the expanded semiconductor chip has a surface provided with second electrodes. The surface of the wiring substrate provided with the first electrodes faces the surface of the expanded semiconductor chip provided with the second electrodes so that the first electrodes are connected to the second electrodes. Each of the second electrodes on the expanded semiconductor chip that is connected to an associated one of the first electrodes is located only on the expanded portion.

In the second semiconductor device, each one of the second electrodes that is connected to an associated one of the first electrodes is located only on the expanded portion. Thus, no second electrodes electrically connected to the first semiconductor chip are provided on the element formation surface of the second semiconductor chip constituting the expanded semiconductor chip. As a result, the influence of thermal stress generated during packaging on electrical characteristics of an active element included in the semiconductor chip can be avoided.

In the second semiconductor device, the second semiconductor chip may include a plurality of semiconductor chips, and the expanded portion of the expanded semiconductor chip may be located between adjacent side surfaces of the semiconductor chips of the second semiconductor chip.

An expanded semiconductor chip according to the present disclosure includes: a plurality of semiconductor chips; an expanded portion located between adjacent side surfaces of the semiconductor chips; and an electrode provided on the expanded portion and electrically connected to an external element.

The expanded semiconductor chip includes the plurality of semiconductor chips; the expanded portion located between adjacent side surfaces of the semiconductor chips; and the electrode provided on the expanded portion and electrically connected to an external element. Thus, no electrodes electrically connected to an external element are provided on the element formation surface of the semiconductor chip. As a result, the influence of thermal stress generated during packaging on electrical characteristics of an active element included in the semiconductor chip can be avoided.

An expanded semiconductor chip according to the present disclosure and a semiconductor device using the expanded semiconductor chip can reduce the influence of thermal stress generated during packaging of semiconductor chips on electrical characteristics of, for example, active elements included in the semiconductor chips with reduced physical damage of components.

BRIEF DESCRIPTION OF THE DRAWINGS

FIG. 1A is a perspective view, FIG. 1B is a plan view, and FIG. 1C is a cross-sectional view taken along line Ic-Ic in FIG. 1B.

FIG. 2A is a perspective view, FIG. 2B is a plan view, and FIG. 2C is a cross-sectional view taken along line IIc-IIc in FIG. 2B.

FIG. 5A is a plan view, and FIG. 5B is a cross-sectional view taken along line Vb-Vb in FIG. 5A.

FIG. 6A is a plan view, and FIG. 6B is a cross-sectional view taken along line VIb-VIb in FIG. 6A.

FIG. 7A is a perspective view, FIG. 7B is a plan view, and FIG. 7C is a cross-sectional view taken along line VIIc-VIIc in FIG. 7B.

DETAILED DESCRIPTION (First Embodiment)

A first embodiment of the present disclosure will be described with reference to FIGS. 1A-1C.

Figure 1A:
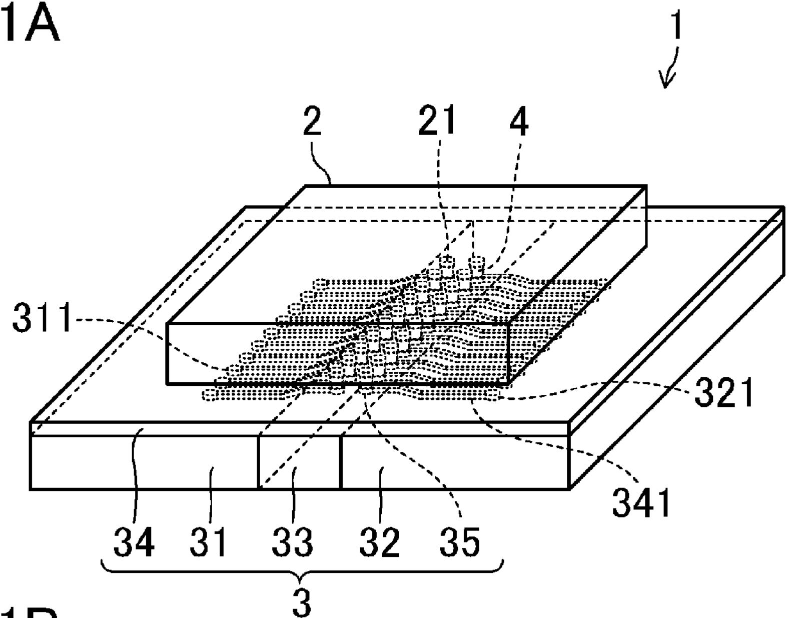
FIGS. 1A-1C illustrate an expanded semiconductor chip and a semiconductor device according to a first embodiment of the present disclosure.
Figure 1B:
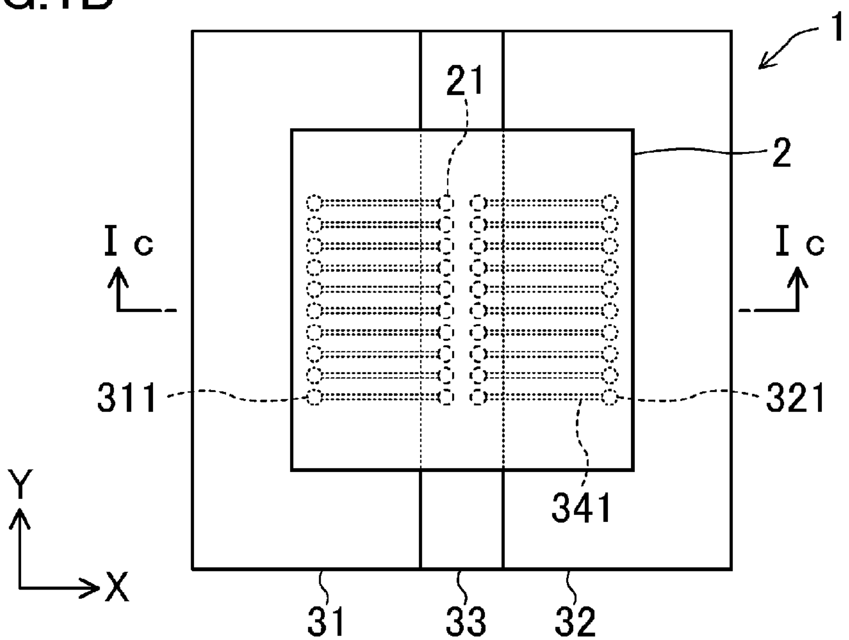
Figure 1C:
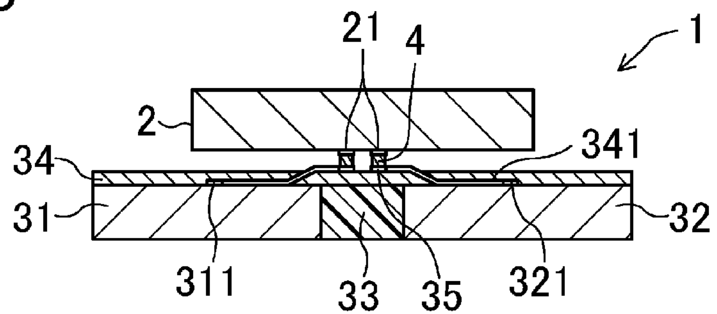

As illustrated in FIGS. 1A-1C, a semiconductor device 1 according to the first embodiment includes: a first semiconductor chip 2 substantially made of, for example, silicon (Si) as a base material and including a transistor and a multilevel interconnect layer; and an expanded semiconductor chip 3 supporting the first semiconductor chip 2 on the upper surface (i.e., an element formation surface) thereof and including a plurality of semiconductor chips 31 and 32. The multilevel interconnect layer of each of the semiconductor chips 2, 31, and 32 includes an insulating layer of, for example, a low-k material.

The element formation surface of the first semiconductor chip 2 facing the expanded semiconductor chip 3 is provided with a plurality of first electrodes (pads) 21 made of a metal such as copper (Cu), aluminium (Al), or nickel (Ni) and used for external connection.

The expanded semiconductor chip 3 includes second and third semiconductor chips 31 and 32 substantially made of, for example, silicon (Si) and each including a transistor and a multilevel interconnect layer. A gap between the adjacent side surfaces of the second and third semiconductor chips 31 and 32 is filled with a resin expanded portion 33 of, for example, an epoxy resin. The second semiconductor chip 31 and the third semiconductor chip 32 are integrated with this resin expanded portion 33 sandwiched therebetween. The resin expanded portion 33 is not necessarily made of a resin material, and the second semiconductor chip 31 and the third semiconductor chip 32 are bonded together by using an adhesive with an insulator such as a ceramic material interposed therebetween.

A plurality of first chip electrodes 311 of a metal such as Cu, Al, or Ni are provided on the second semiconductor chip 31. Similarly, a plurality of second chip electrodes 321 of a metal such as Cu, Al, or Ni are provided on the third semiconductor chip 32. A re-distribution layer 34 of an insulator such as polyimide is provided on the upper surfaces of the integrally formed second semiconductor chip 31, third semiconductor chip 32, and resin expanded portion 33. A plurality of interconnects 341 of, for example, Cu or Al are provided inside the re-distribution layer 34. A plurality of second electrodes (pads) 35 made of, for example, a metal such as Cu, Al, or Ni and used for external connection are provided on the re-distribution layer 34. An end of each of the interconnects 341 is electrically connected to one of the first chip electrodes 311 or the second chip electrodes 321, and the other end of each of the interconnects 341 is electrically connected to one of the second electrodes 35 on the re-distribution layer 34.

The first electrodes 21 on the first semiconductor chip 2 are opposed to, i.e., face, the second electrodes 35 on the expanded semiconductor chip 3. The opposing first electrodes 21 and the second electrodes 35 are connected to each other with metal protrusions (bumps) 4 of, for example, solder or gold interposed therebetween.

A feature of the first embodiment is that all the second electrodes 35 on the upper surface of the expanded semiconductor chip 3 are located directly above the resin expanded portion 33. Electrodes for inspection (not shown), for example, may be provided on regions of the re-distribution layer 34 that do not face the first semiconductor chip 2 and are located on the element formation surfaces of the semiconductor chips 31 and 32.

As illustrated in FIG. 1B, in the first embodiment, the first electrodes 21 are disposed in a substantially center portion of the first semiconductor chip 2 and are arranged in an array in which the number of electrodes in a Y direction is larger than that of electrodes in an X direction. Thus, the resin expanded portion 33 of the expanded semiconductor chip 3 is designed such that the length in the Y direction is larger than that in the X direction between the second semiconductor chip 31 and the third semiconductor chip 32 in order to allow the second electrodes 35 on the expanded semiconductor chip 3 to be arranged in accordance with the arrangement of the first electrodes 21 on the first semiconductor chip 2.

A center portion of a chip herein refers to a relative positional relationship between the region where the first electrodes 21 are located and the outer shape of the first semiconductor chip 2. Specifically, a center portion of a chip is defined within a range of D/2 or less from the center of the semiconductor chip where D is the distance from the center of the semiconductor chip to a corner of the chip.

FIGS. 1A and 1B schematically illustrate the array of the first electrodes 21 having two rows and ten columns. However, larger numbers of rows and columns are provided in an actual semiconductor device. Specifically, about 10 rows are provided in the X direction, and about 100 columns are provided in the Y direction. The first electrodes 21 are expected to be spaced at intervals of about 40-50 μm.

Figure 2A:
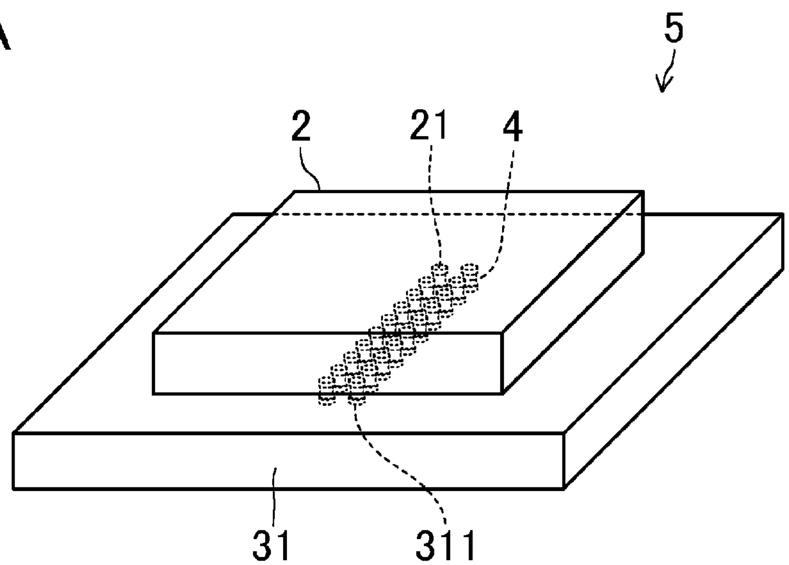
FIG. 2A-2C illustrate a semiconductor device of a comparative example.
Figure 2B:
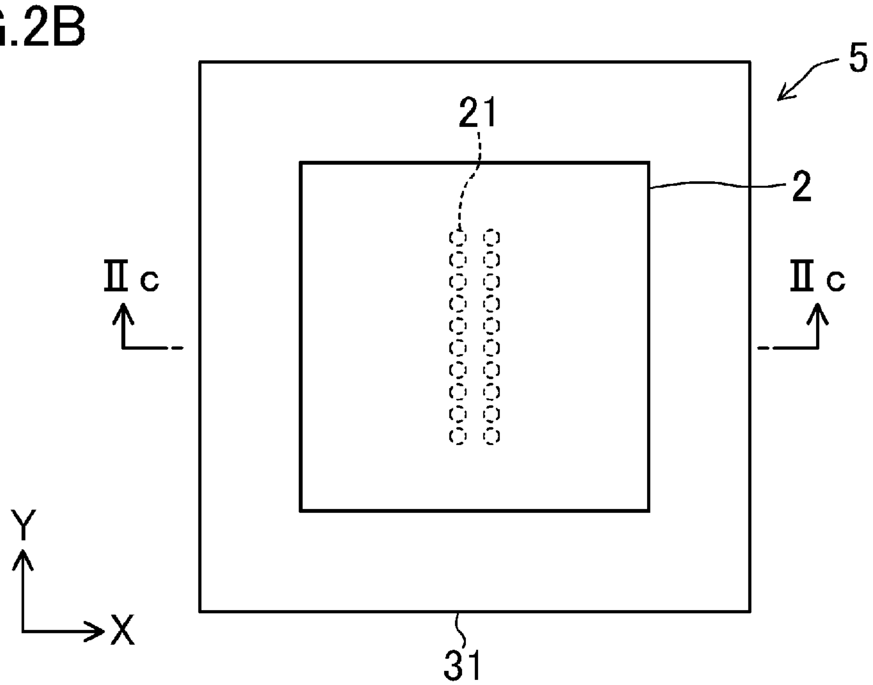
Figure 2C:
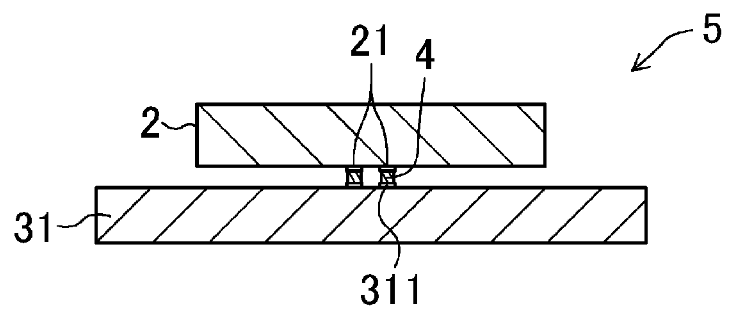

It will now be described why the semiconductor device 1 with the above-described configuration can reduce the influence of thermal stress generated during packaging of the first semiconductor chip 2 and the expanded semiconductor chip 3 on electrical characteristics of transistors in the semiconductor chips with reduced physical damage such as cracks in, or peeling of, the insulating layers of the low-k materials included in the multilevel interconnect layers of the semiconductor chips 2 and 3. Here, a semiconductor device 5 illustrated in FIGS. 2A-2C is a comparative example. Components already shown in FIGS. 1A-1C are denoted by the same reference characters in FIGS. 2A-2C. A second semiconductor chip 31 constituting the semiconductor device 5 illustrated in FIGS. 2A-2C is a single chip and includes no resin expanded portion. Thus, first chip electrodes 311 on the second semiconductor chip 31 are directly connected to first electrodes 21 on a first semiconductor chip 2 by metal protrusions 4.

In solder bonding, which is a typical technique of CoC bonding, opposing semiconductor chips for each of which solder is previously placed on electrodes thereon are brought into contact with each other, and then solder is melted by heating and then solidified by cooling in order to bond the semiconductor chips together. In the comparative example illustrated in FIGS. 2A-2C, each of the semiconductor chips 2 and 31 is substantially made of silicon (Si), which has a high rigidity and a low linear expansion coefficient, as a base material, and thus, deformation caused by stress due to contraction of melted solder occurring upon solidification or cooling cannot be absorbed. Accordingly, stress remains on the element formation surfaces of the semiconductor chips 2 and 31. Transistors formed on the element formation surfaces are easily affected by the stress thereon, and the residual stress causes a large variation of a source/drain current. In the insulating layers of the low-k materials on the element formation surfaces, cracks might occur, and peeling might also occur at the interface or the vicinity thereof, under the influence of the residual stress.

On the other hand, as illustrated in FIG. 1C, in the semiconductor device 1 of the first embodiment, only the resin expanded portion 33 having a low rigidity and a linear expansion coefficient relatively close to that of, for example, solder constituting the metal protrusions 4 is formed in a region of the expanded semiconductor chip 3 to be bonded to the first semiconductor chip 2 via the metal protrusions 4. This configuration can reduce residual stress on the element formation surface of the first semiconductor chip 2. In addition, since no metal protrusions 4 are located on the element formation surfaces of the second semiconductor chip 31 and the third semiconductor chip 32 constituting the expanded semiconductor chip 3, the influence of residual stress from the metal protrusions 4 can be avoided.

As in the first embodiment, in the configuration in which the first semiconductor chip 2 is mounted on the expanded semiconductor chip 3 including a plurality of semiconductor chips (i.e., the second semiconductor chip 31 and the third semiconductor chip 32), even when the pads on the first semiconductor chip 2 are locally disposed only in a specific region of the element formation surface, the pads on the second semiconductor chip 31 and the third semiconductor chip 32 can be extended to regions on the resin expanded portion 33 and are arranged in accordance with the arrangement of the pads on the first semiconductor chip 2. For example, in a case where the first semiconductor chip 2 is a memory chip on which pads are locally disposed on a center portion of the element formation surface, pads on a plurality of semiconductor chips can be collectively disposed on the resin expanded portion 33 so that the pads on the memory chip can face the pads on the resin expanded portion 33. This configuration can eliminate the necessity of preparing a memory chip with a special pad arrangement in accordance with the arrangement of pads on a plurality of lower chips, and thus, a general-purpose memory can be used.

As described above, in the first embodiment, the first electrodes 21 on the first semiconductor chip 2 and the second electrodes 35 on the expanded semiconductor chip 3 are located in a substantially center portion of the first semiconductor chip 2 and form an array in which the number of electrodes in the Y direction is larger than that of electrodes in the X direction. Thus, the expanded semiconductor chip 3 is constituted by the two semiconductor chips 31 and 32, and the resin expanded portion 33 is extended in the Y direction between the semiconductor chips 31 and 32. The planar shape of the resin expanded portion 33 is not limited to the shape illustrated in FIG. 1B, and may be suitably changed in accordance with the arrangement of the first electrodes 21 on the first semiconductor chip 2.

Variations of the first embodiment will now be described with reference to FIGS. 3-6.

(First Variation of First Embodiment)

Figure 3:
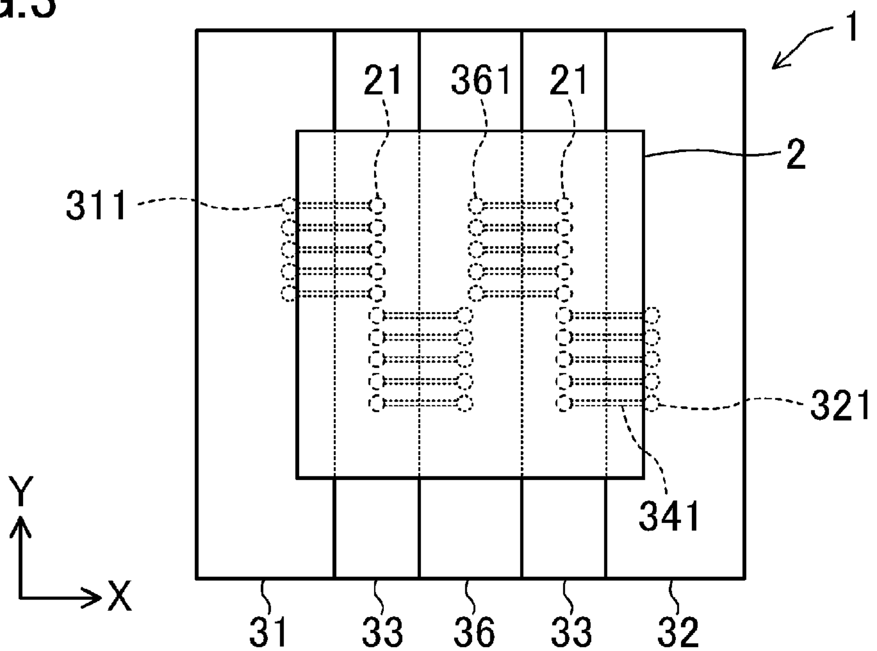
FIG. 3 is a plan view illustrating an expanded semiconductor chip and a semiconductor device according to a first variation of the first embodiment.

FIG. 3 illustrates a planar configuration of a semiconductor device according to a first variation of the first embodiment. As illustrated in FIG. 3, in a semiconductor device 1 of the first variation, the first electrodes 21 on the first semiconductor chip 2 are disposed in a substantially center portion of the first semiconductor chip 2 in an array such that the array is long in the Y direction and the distance between the electrodes 21 is relatively large in the X direction. In the case of this arrangement of the first electrodes 21, the expanded semiconductor chip 3 is constituted by three chips of the second semiconductor chip 31, the third semiconductor chip 32, and a fourth semiconductor chip 36. Specifically, for example, the fourth semiconductor chip 36 is sandwiched between the second semiconductor chip 31 and the third semiconductor chip 32.

The resin expanded portions 33 are provided between the second semiconductor chip 31 and the fourth semiconductor chip 36 and between the third semiconductor chip 32 and the fourth semiconductor chip 36 such that the resin expanded portions 33 are integrated with the second semiconductor chip 31, the third semiconductor chip 32, and the fourth semiconductor chip 36. In addition, second electrodes (not shown) on the expanded semiconductor chip 3 are disposed such that the first electrodes 21 face, i.e., are located immediately above, the resin expanded portions 33.

(Second Variation of First Embodiment)

Figure 4:
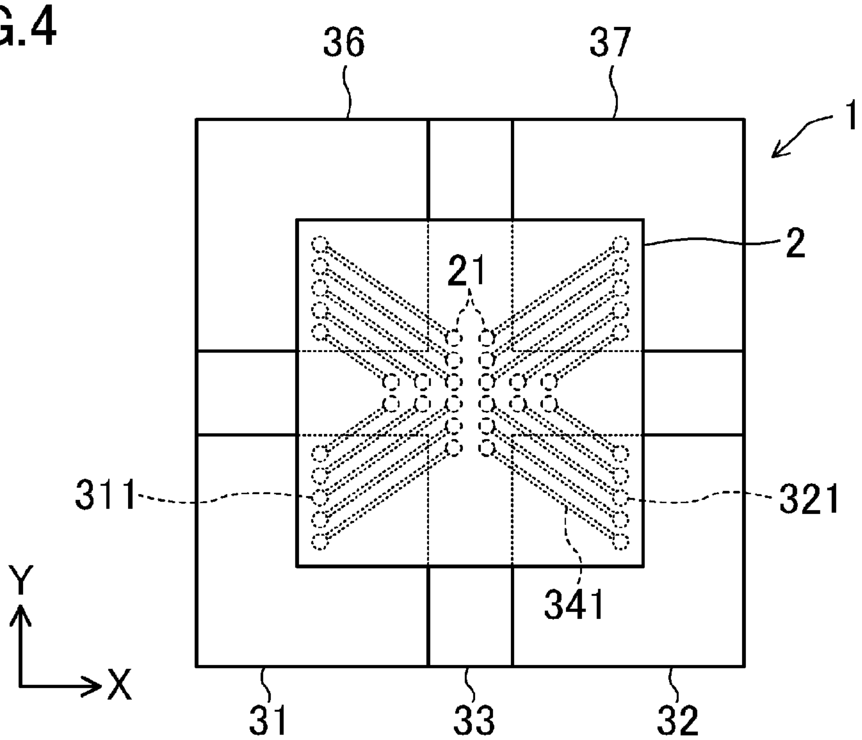
FIG. 4 is a plan view illustrating an expanded semiconductor chip and a semiconductor device according to a second variation of the first embodiment.

FIG. 4 illustrates a planar configuration of a semiconductor device according to a second variation of the first embodiment. As illustrated in FIG. 4, in a semiconductor device 1 of the second variation, the first electrodes 21 on the first semiconductor chip 2 are locally disposed on a substantially center portion of the first semiconductor chip 2 and form a cross shape in cross section. In the case of this arrangement of the first electrodes 21, the expanded semiconductor chip 3 is constituted by four chips of the second semiconductor chip 31, the third semiconductor chip 32, the fourth semiconductor chip 36, and a fifth semiconductor chip 37. Specifically, for example, each of the semiconductor chips 31 and 32, 36, and 37 are arranged in two rows and two columns, and the resin expanded portions 33 are disposed between opposed side surfaces of the semiconductor chips 31, 32, 36, and 37.

For example, the resin expanded portions 33 are provided between the second semiconductor chip 31 and the third semiconductor chip 32, between the third semiconductor chip 32 and the fifth semiconductor chip 37, between the fifth semiconductor chip 37 and the fourth semiconductor chip 36, and between the fourth semiconductor chip 36 and the second semiconductor chip 31 such that the resin expanded portions 33 are integrated with the semiconductor chips 31, 32, 36, and 37. In addition, second electrodes (not shown) on the expanded semiconductor chip 3 are disposed such that the first electrodes 21 face, i.e., are located immediately above, the resin expanded portions 33.

(Third Variation of First Embodiment)

Figure 5A:
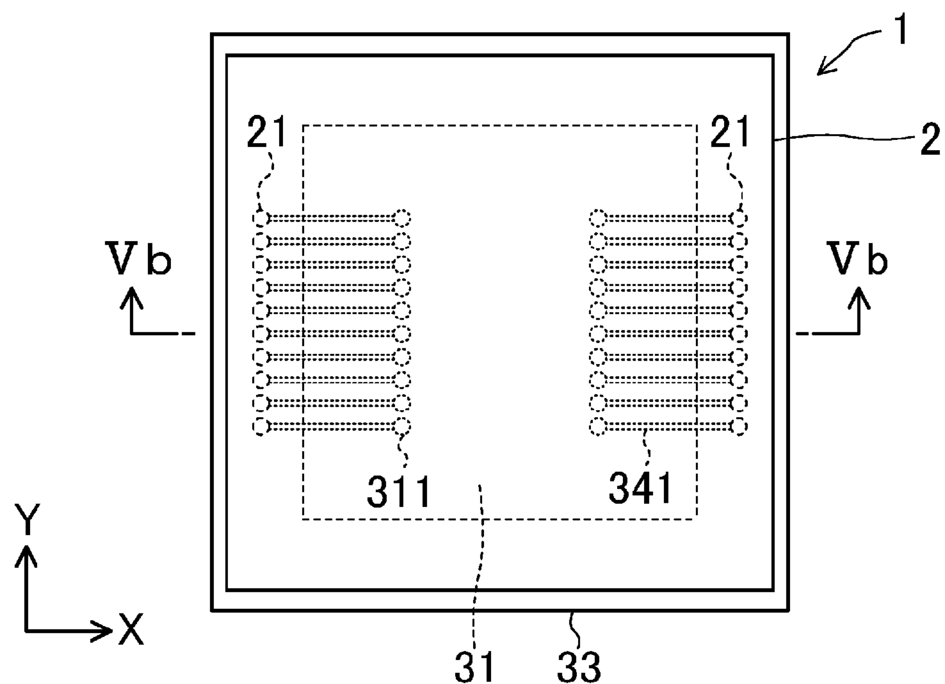
FIGS. 5A and 5B illustrate a semiconductor device according to a third variation of the first embodiment.
Figure 5B:
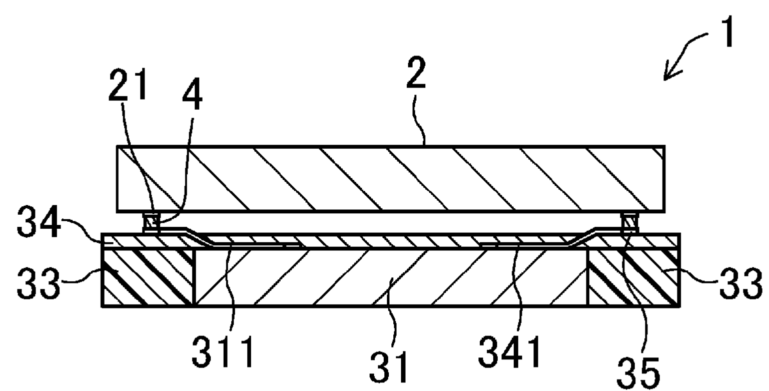

FIGS. 5A and 5B illustrate a planar configuration and a cross-sectional configuration, respectively, of a semiconductor device according to a third variation of the first embodiment. As illustrated in FIG. 5A, in a semiconductor device 1 of the third variation, the first electrodes 21 on the first semiconductor chip 2 are disposed in a single column near and along each of two opposing sides of the first semiconductor chip 2. In the case of this arrangement of the first electrodes 21, the expanded semiconductor chip 3 is constituted only by the second semiconductor chip 31. The resin expanded portion 33 is provided on each of all the four sides of the second semiconductor chip 31, i.e., surrounds the second semiconductor chip 31 such that the resin expanded portion 33 is integrated with the second semiconductor chip 31. In addition, the second electrodes 35 on the expanded semiconductor chip 3 are disposed such that the first electrodes 21 face, i.e., are located immediately above, the resin expanded portion 33.

(Fourth Variation of First Embodiment)

Figure 6A:
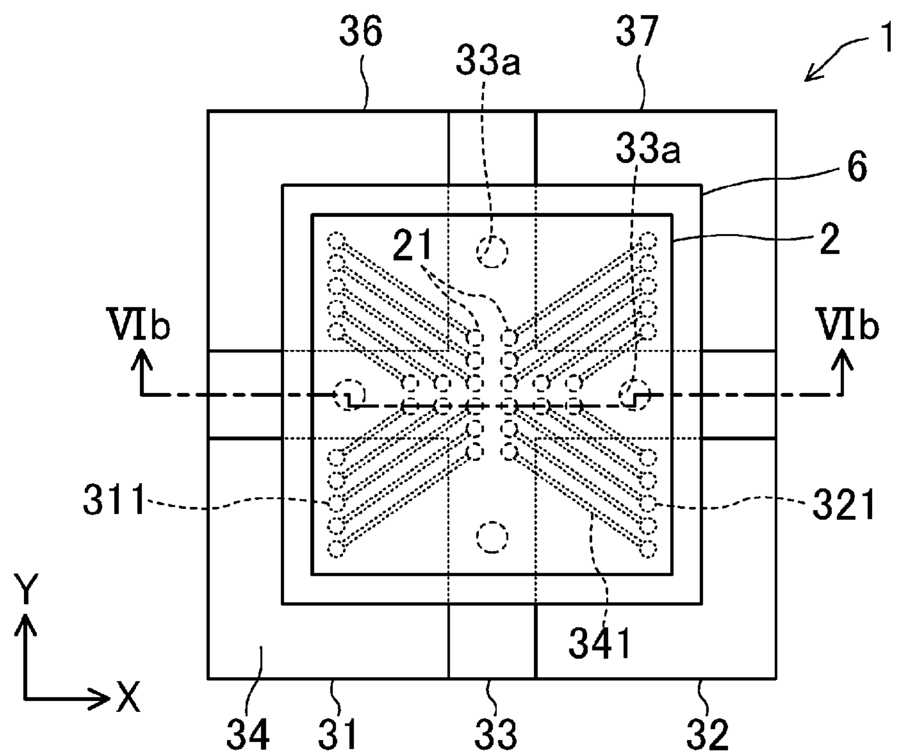
FIGS. 6A and 6B illustrate an expanded semiconductor chip and a semiconductor device according to a fourth variation of the first embodiment.
Figure 6B:
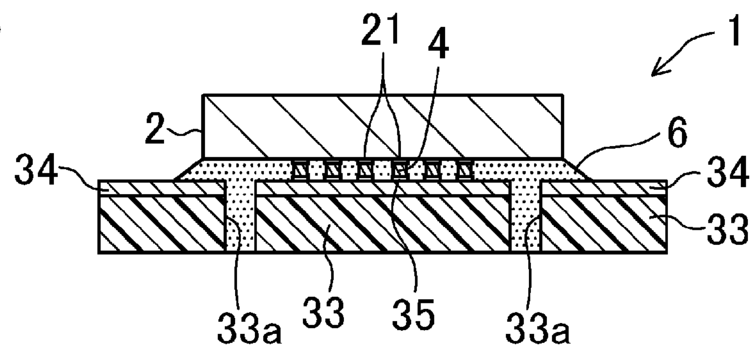

FIGS. 6A and 6B illustrate a planar configuration and a cross-sectional configuration, respectively, of a semiconductor device according to a fourth variation of the first embodiment. As illustrated in FIGS. 6A and 6B, in a semiconductor device 1 of the fourth variation, in a manner similar to the semiconductor device 1 of the second variation illustrated in FIG. 4, the expanded semiconductor chip 3 is constituted by four chips of the semiconductor chips 31, 32, 36, and 37.

The fourth variation is different from the second variation in that the resin expanded portion 33 constituting the expanded semiconductor chip 3 includes through holes 33*a* penetrating the resin expanded portion 33 in a region that faces the first semiconductor chip 2 and provided with no metal protrusions 4.

Specifically, as illustrated in FIG. 6A, the through holes 33*a* penetrating the resin expanded portion 33 and the re-distribution layer 34 from the top to the bottom are located in a region of the cross-shaped resin expanded portion 33 that extends outward from the first electrodes 21 on the first semiconductor chip 2 and inside the outline (i.e., all the side surfaces) of the first semiconductor chip 2 in plan view.

The first semiconductor chip 2 and the expanded semiconductor chip 3 are connected to each other by the metal protrusions 4, and then, an underfill material 6, which is an encapsulating resin material, is injected into a gap between the first semiconductor chip 2 and the expanded semiconductor chip 3. At this time, in a case where the height of the metal protrusions 4 is small, a conventional technique of injecting the underfill material 6 from the side of the first semiconductor chip 2 cannot sufficiently fill the gap with the underfill material 6. Consequently, voids might be formed near the metal protrusions 4 in this case.

On the other hand, in the fourth variation, after connection by the metal protrusions 4, the underfill material 6 is directly injected into gaps close to the metal protrusions 4 through the previously-formed through holes 33*a* from the back surface of the expanded semiconductor chip 3. In this manner, gaps around the metal protrusions 4 can be more sufficiently filled with the underfill material 6.

The number of the through holes 33*a* provided in each of the resin expanded portion 33 and the re-distribution layer 34 may be appropriately adjusted in accordance with the sizes and numbers of the semiconductor chips 2 and 3. The through holes 33*a* of the fourth variation are applicable to the semiconductor devices 1 of the first embodiment and the first and third variations thereof.

(Second Embodiment)

A second embodiment of the present disclosure will be described with reference to FIGS. 7A-7C.

Figure 7A:
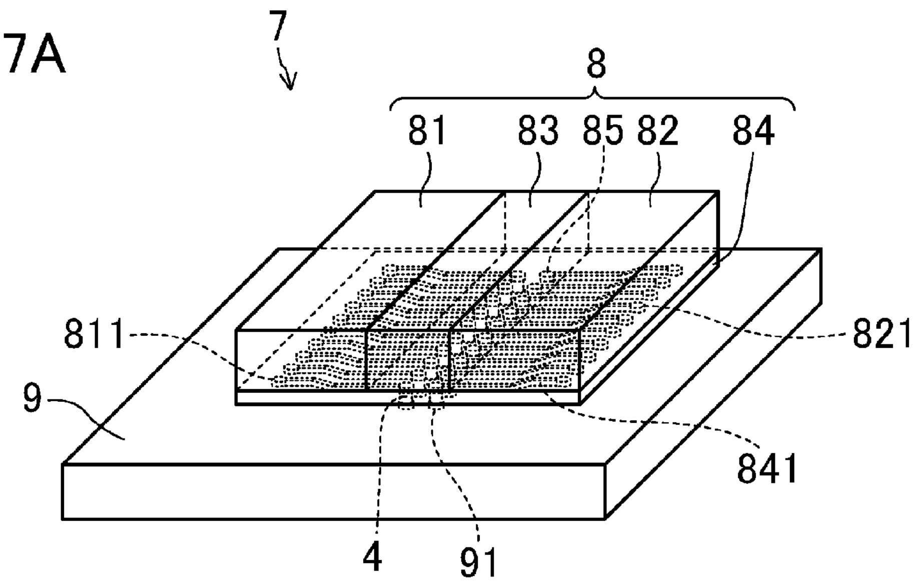
FIG. 7A-7C illustrate an expanded semiconductor chip and a semiconductor device according to a second embodiment of the present disclosure.
Figure 7B:
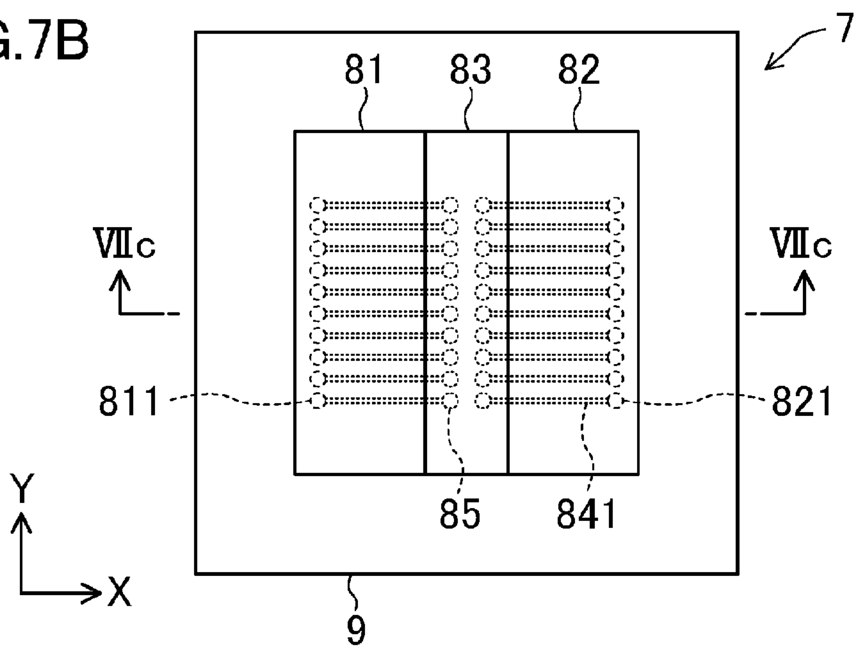
Figure 7C:
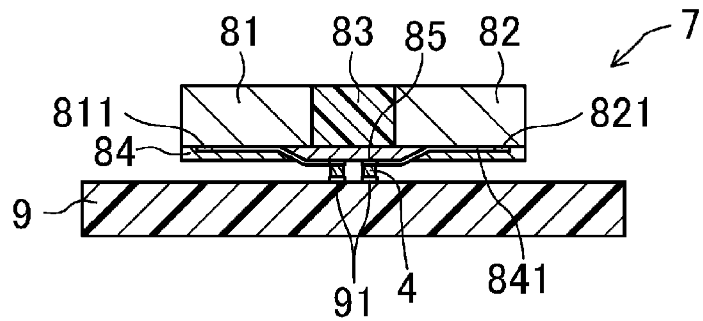

As illustrated in FIGS. 7A-7C, a semiconductor device 7 according to the second embodiment includes: an expanded semiconductor chip 8 including first and second semiconductor chips 81 and 82 substantially made of, for example, silicon (Si) as a base material and each including a transistor and a multilevel interconnect layer; and a resin substrate (a wiring substrate) 9 supporting the expanded semiconductor chip 8 on the upper surface thereof and substantially made of, for example, an epoxy resin as a base material. The multilevel interconnect layer of each of the semiconductor chips 81 and 82 includes an insulating layer of, for example, a low-k material.

A gap between adjacent side surfaces of the first and second semiconductor chips 81 and 82 in the expanded semiconductor chip 8 is filled with a resin expanded portion 83 of, for example, an epoxy resin. The first semiconductor chip 81 and the second semiconductor chip 82 are integrated with this resin expanded portion 83 sandwiched therebetween.

A plurality of first chip electrodes 811 of a metal such as copper (Cu), aluminium (Al), or nickel (Ni) are provided on an element formation surface of the first semiconductor chip 81 facing the resin substrate 9. Similarly, a plurality of second chip electrodes 821 of a metal such as Cu, Al, or Ni are formed on an element formation surface of the second semiconductor chip 82. A re-distribution layer 84 of an insulator such as polyimide is provided on the integrally formed first semiconductor chip 81, the second semiconductor chip 82, and the resin expanded portion 83. A plurality of interconnects 841 of, for example, Cu or Al are provided inside the re-distribution layer 84. A plurality of first electrodes (pads) 85 made of, for example, a metal such as Cu, Al, or Ni and used for external connection are provided on the re-distribution layer 84. An end of each of the interconnects 841 is electrically connected to one of the first chip electrodes 811 or the second chip electrodes 821, and the other end of the interconnects 841 is electrically connected to one of the first electrodes 85 on the re-distribution layer 84.

A plurality of second electrodes (pads) 91 are provided on the resin substrate 9 and opposed to the first electrodes 85 of the expanded semiconductor chip 8. The opposing first electrodes 85 and the second electrodes 91 are connected to each other with metal protrusions (bumps) 4 of, for example, solder or gold interposed therebetween.

A feature of the second embodiment is that all the first electrodes 85 on the element formation surface of the expanded semiconductor chip 8 are located directly above the resin expanded portion 83. Electrodes for inspection (not shown), for example, may be provided on regions of the re-distribution layer 84 that do not face the second electrodes 91 on the resin substrate 9 and are located on the element formation surfaces of the semiconductor chips 31 and 32.

As illustrated in FIG. 7B, in the second embodiment, the second electrodes 91 are disposed on a substantially center portion of the resin substrate 9 and are arranged in an array in which the number of electrodes in a Y direction is larger than that of an X direction. Thus, the resin expanded portion 83 of the expanded semiconductor chip 8 is designed such that the length in the Y direction is larger than that in the X direction between the first semiconductor chip 81 and the second semiconductor chip 82 in order to allow the first electrodes 85 on the expanded semiconductor chip 8 to be arranged in accordance with the arrangement of the second electrodes 91 on the resin substrate 9.

FIGS. 7A and 7B schematically illustrate the array of the second electrodes 91 having two rows and ten columns. However, larger numbers of rows and columns are provided in an actual semiconductor device. Specifically, about 10 rows are provided in the X direction, and about 100 columns are provided in the Y direction. The first electrodes 21 are expected to be spaced at intervals of about 40-50 μm.

The planar shape of the resin expanded portion 83 is not limited to the shape illustrated in FIG. 7B, and may be suitably changed in accordance with the arrangement of the second electrodes 91 on the resin substrate 9.

The semiconductor device 7 of the second embodiment can reduce the influence of thermal stress generated during packaging of the expanded semiconductor chip 8 on electrical characteristics of transistors in the semiconductor chips 81 and 82 with reduced physical damage such as cracks in, or peeling of, the insulating layer of the low-k material.

That is, in a manner similar to that in the first embodiment, since no metal protrusions 4 called bumps are present on the element formation surfaces of the first semiconductor chip 81 and the second semiconductor chip 82 constituting the expanded semiconductor chip 8, the influence of, for example, contraction of the resin substrate 9 and contraction of the metal protrusions 4 caused by solidification or cooling is not transferred to the element formation surfaces. As a result, the influence of the residual stress on the resin substrate 9 and the metal protrusions 4 can be avoided.

An expanded semiconductor chip and a semiconductor device according to the present disclosure can reduce the influence of thermal stress generated in packaging of semiconductor chips on electrical characteristics of, for example, active elements with reduced physical damage of components, and is useful particularly for, for example, a semiconductor device including a face-down mounted expanded semiconductor chip.

What is claimed is:

1. A semiconductor device comprising:

a first semiconductor chip having a first element formation surface provided with first electrodes; and an expanded semiconductor chip including a second semiconductor chip having a second element formation surface and an expanded portion extending outward from at least one side surface of the second semiconductor chip, the expanded semiconductor chip having a surface provided with second electrodes on a same side of the expanded semiconductor chip as the second element formation surface, wherein, the first element formation surface of the first semiconductor chip faces the second element formation surface of the second semiconductor chip, the first element formation surface of the first semiconductor chip provided with the first electrodes faces the surface of the expanded semiconductor chip provided with the second electrodes so that the first electrodes are connected to the second electrodes, and each one of the second electrodes that is connected to an associated one of the first electrodes is located only on the expanded portion.

2. The semiconductor device of claim 1, wherein the second semiconductor chip includes a plurality of semiconductor chips, and the expanded portion of the expanded semiconductor chip is located between adjacent side surfaces of the semiconductor chips of the second semiconductor chip.

3. The semiconductor device of claim 1, wherein the expanded portion of the expanded semiconductor chip is located around the second semiconductor chip.

4. The semiconductor device of claim 1, wherein the expanded semiconductor chip includes an interconnection that connects the second electrodes on a surface of the expanded portion to third electrodes on the second element formation surface of the second semiconductor chip.

5. The semiconductor device of claim 1, wherein the expanded portion has a through hole in a region facing the first semiconductor chip, and a gap between the first semiconductor chip and the expanded semiconductor chip and the through hole are filled with an encapsulating resin material.

6. A semiconductor device comprising:

a wiring substrate having a first surface provided with first electrodes; and an expanded semiconductor chip including a semiconductor chip having an element formation surface and an expanded portion extending outward from at least one side surface of the semiconductor chip, the expanded semiconductor chip having a surface provided with second electrodes on a same side of the expanded semiconductor chip as the element formation surface, wherein the first surface of the wiring substrate faces the element formation surface of the semiconductor chip, the first surface of the wiring substrate provided with the first electrodes faces the surface of the expanded semiconductor chip provided with the second electrodes so that the first electrodes are connected to the second electrodes, and each one of the second electrodes that is connected to an associated one of the first electrodes is located only on the expanded portion.

7. The semiconductor device of claim 6, wherein the semiconductor chip includes a plurality of semiconductor chips, and the expanded portion of the expanded semiconductor chip is located between adjacent side surfaces of the semiconductor chips of the semiconductor chip.

* * * * *